US012078667B1

(12) United States Patent
Nuutinen et al.

(10) Patent No.: US 12,078,667 B1
(45) Date of Patent: Sep. 3, 2024

(54) POSITIONING AND WEIGHTING TEST PROBES IN AN ANECHOIC CHAMBER

(71) Applicant: Spirent Communications, Inc., San Jose, CA (US)

(72) Inventors: Jukka-Pekka Nuutinen, Martinniemi (FI); John Douglas Reed, Arlington, TX (US); Alfonso Rodriguez-Herrera, Denton, TX (US)

(73) Assignee: SPIRENT COMMUNICATIONS, INC., San Jose, CA (US)

( * ) Notice: Subject to any disclaimer, the term of this patent is extended or adjusted under 35 U.S.C. 154(b) by 574 days.

(21) Appl. No.: 17/175,545

(22) Filed: Feb. 12, 2021

Related U.S. Application Data

(60) Provisional application No. 62/981,998, filed on Feb. 26, 2020, provisional application No. 62/976,340, filed on Feb. 13, 2020.

(51) Int. Cl.
*H04B 17/11* (2015.01)
*G01R 29/08* (2006.01)
(Continued)

(52) U.S. Cl.
CPC ....... *G01R 29/0821* (2013.01); *G01R 29/105* (2013.01); *H04B 17/102* (2015.01); *H04B 17/3912* (2015.01); *H04B 7/0413* (2013.01)

(58) Field of Classification Search
CPC .. G01R 29/0821; G01R 29/105; G01R 29/08; G01R 29/0807; H04B 17/0085;
(Continued)

(56) References Cited

U.S. PATENT DOCUMENTS 10,033,473 B1 * 7/2018 Kyrolainen ........ H04B 17/3911
10,686,318 B2 * 6/2020 Taga ..................... H02J 7/0013
(Continued)

FOREIGN PATENT DOCUMENTS

CN   111865371 A  * 10/2020 ............. H04B 17/15

OTHER PUBLICATIONS

IEEE transactions on Antennas and Propagation, vol. 66, No. 10, Oct. 2018, On Radiated Performance Evaluation of Massive MIMO Devices in Multiprobe Anechoic Chamber OTA Setups (Year: 2018).*

(Continued)

*Primary Examiner* — Blane J Jackson
(74) *Attorney, Agent, or Firm* — HAYNES BEFFEL & WOLFELD LLP; Ernest J. Beffel, Jr.

(57) ABSTRACT

Disclosed is an anechoic test chamber that includes six antenna probes, replacing a single probe with a small array, and using the array to form a beam to provide a similar signal to the probe signal, and reducing the transmission loss. At least five of the probes are aligned in the anechoic chamber such that the probes are aligned in azimuth along four columns separated from a center point by +/−5 degrees and +/−15 degrees. The probes are further aligned in elevation along three rows at the center point and separated from the center point by +/−5 degrees, wherein the alignments in azimuth and elevation are within 3 degrees measured spherically of the alignments stated. Also disclosed is a planar array that replaces probe antennas and forms beams to provide coverage to the chamber, and utilizing probe arrays to emulate base station signals to evaluate UE performance.

16 Claims, 11 Drawing Sheets
(2 of 11 Drawing Sheet(s) Filed in Color)

Combined Probe Layout for CDL-A InO and CDL-C UMi

(51) Int. Cl.
  *G01R 29/10* (2006.01)
  *H04B 17/10* (2015.01)
  *H04B 17/391* (2015.01)
  *H04B 7/0413* (2017.01)

(58) Field of Classification Search
  CPC .. H04B 17/101; H04B 17/102; H04B 17/391; H04B 17/3911; H04B 17/3912; H04B 7/043
  See application file for complete search history.

(56) References Cited

U.S. PATENT DOCUMENTS

| | | | |
|---|---|---|---|
| 11,757,542 B2* | 9/2023 | Lin | H04B 17/3912 455/67.11 |
| 2020/0209296 A1* | 7/2020 | Kong | H04B 7/0695 |
| 2020/0213883 A1* | 7/2020 | Kong | H04W 72/51 |

OTHER PUBLICATIONS

3rd Generation Partnership Project (3GPP); Technical Specification Group Radio Access Network (RAN); Study on Radiated Metrics and Test Methodology for the Verification of Multi-Antenna Reception Performance of NR User Equipment (UE); (Release 16), 3GPP TR 38.827 V1.4.0 (Jun. 2020). 82 pages.

Jukka-Pekka Nuutinen, et al, "5G MIMO OTA Testing on Frequency Range 2 (FR2)" URSI GASS 2020, Rome, Italy, Aug. 29-Sep. 5, 2020, 4 pages.

Kyosti, et al, "On Radiated Performance Evaluation of Massive MIMO Devices in Multiprobe Anechoic Chamber OTA Setups", IEEE Transactions on Antennas and Propagation, vol. 66, No. 10, Oct. 2018, 13 pages.

3rd Generation Partnership Project (3GPP), TSG-RAN WG4 Meeting NR AH2, "Performance Evaluation Metrics for RRM/Demodulation Measurement Setup", R4-1706668, Keysight, Qingdao, China, Jun. 27-29, 2017, 4 pages.

* cited by examiner

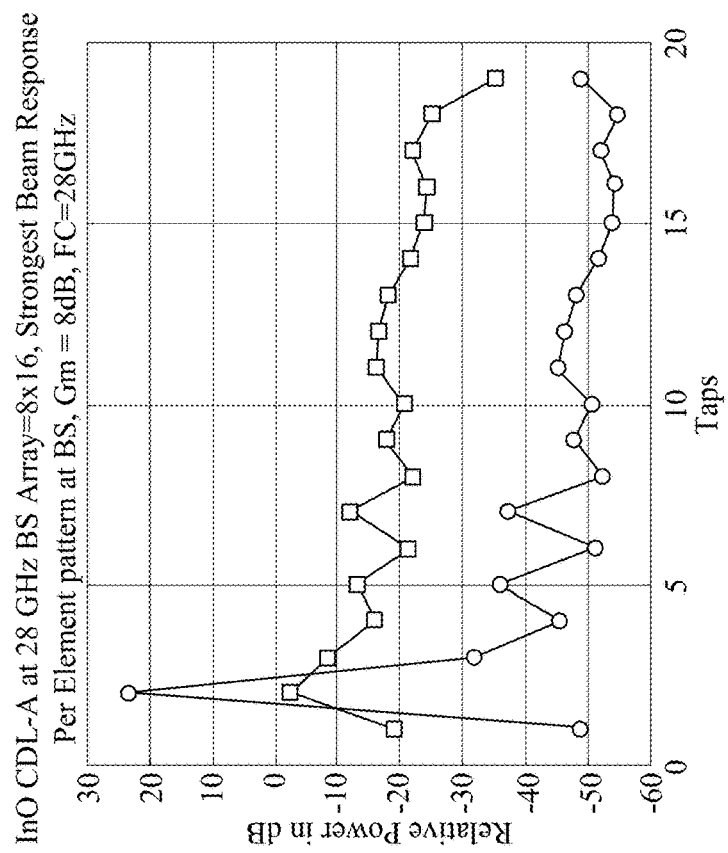
FIG. 1A Clusters after gNb filtering UMi CDL-C (Prior Art)
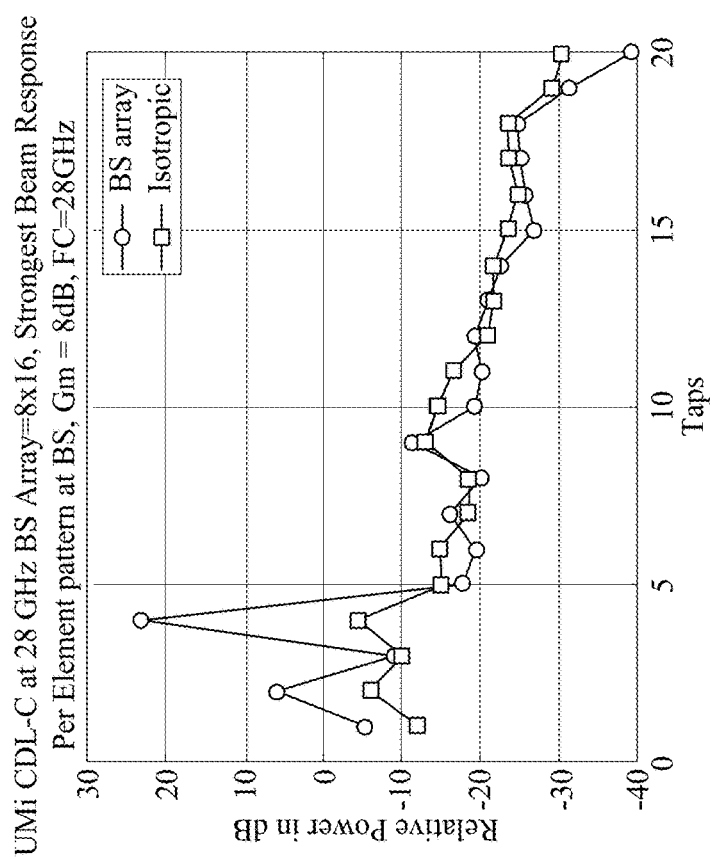
FIG. 1B Clusters after gNb filtering InO CDL-A (Prior Art)

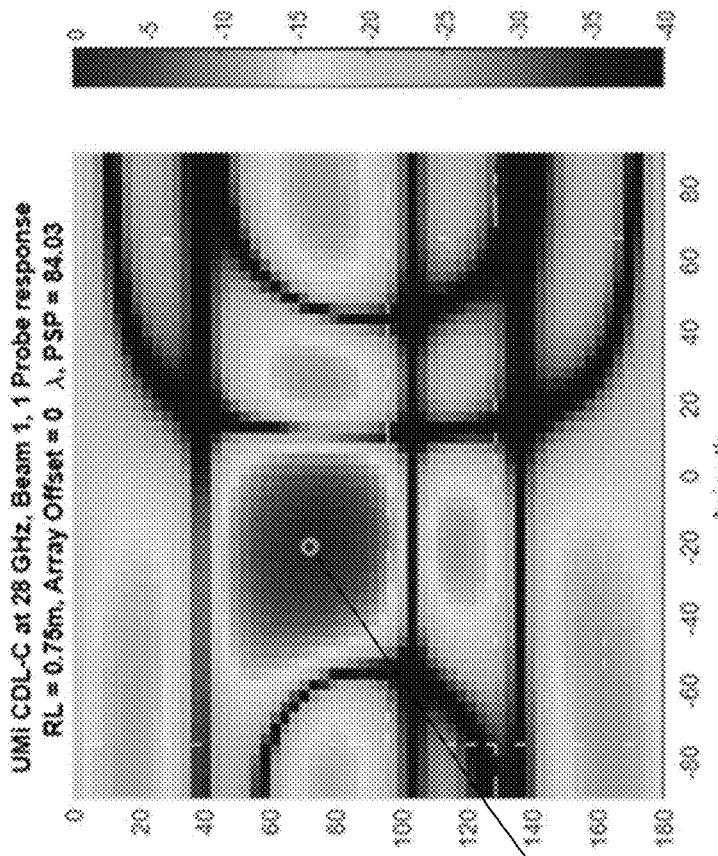
FIG. 2B PSP of CDL-C UMi with strongest direction plotted (Prior Art)
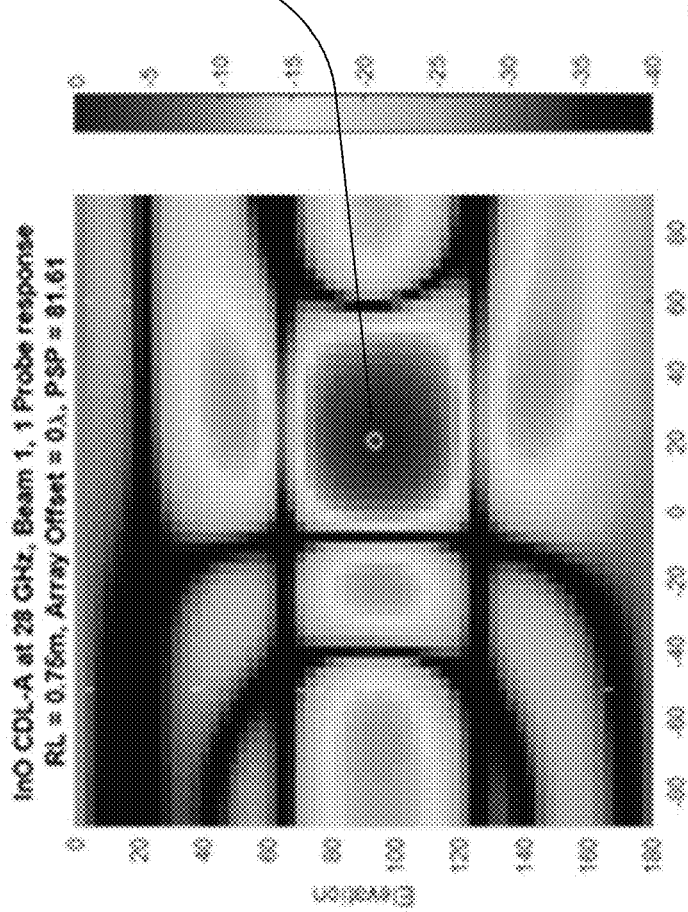
FIG. 2A PSP of CDL-A InO with strongest direction plotted (Prior Art)

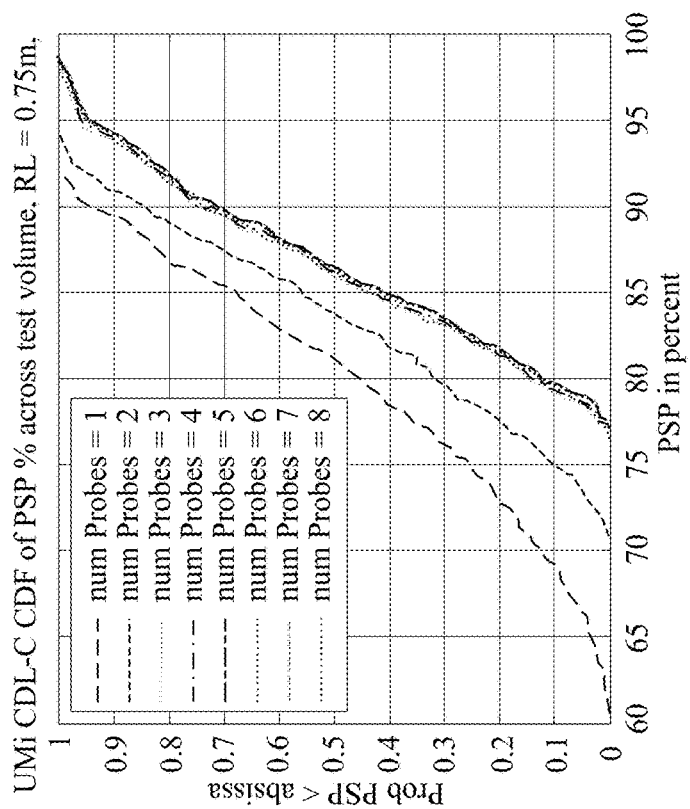
FIG. 3B PSP across the test volume, effect of probe count to CDL-C UMi (Prior Art)
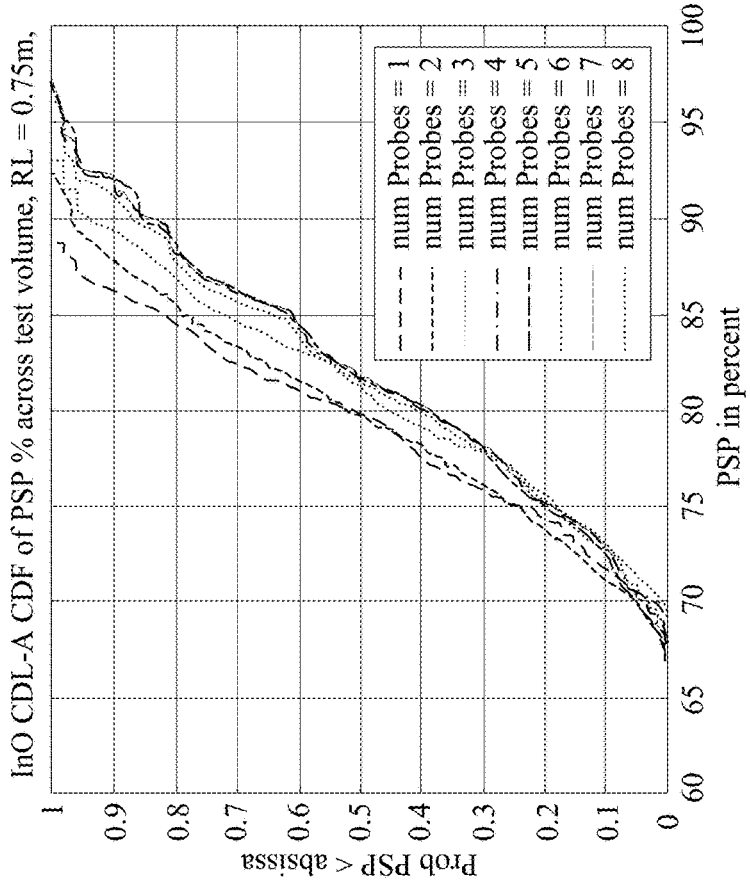
FIG. 3A PSP across the test volume, effect of probe count to CDL-A InO (Prior Art)

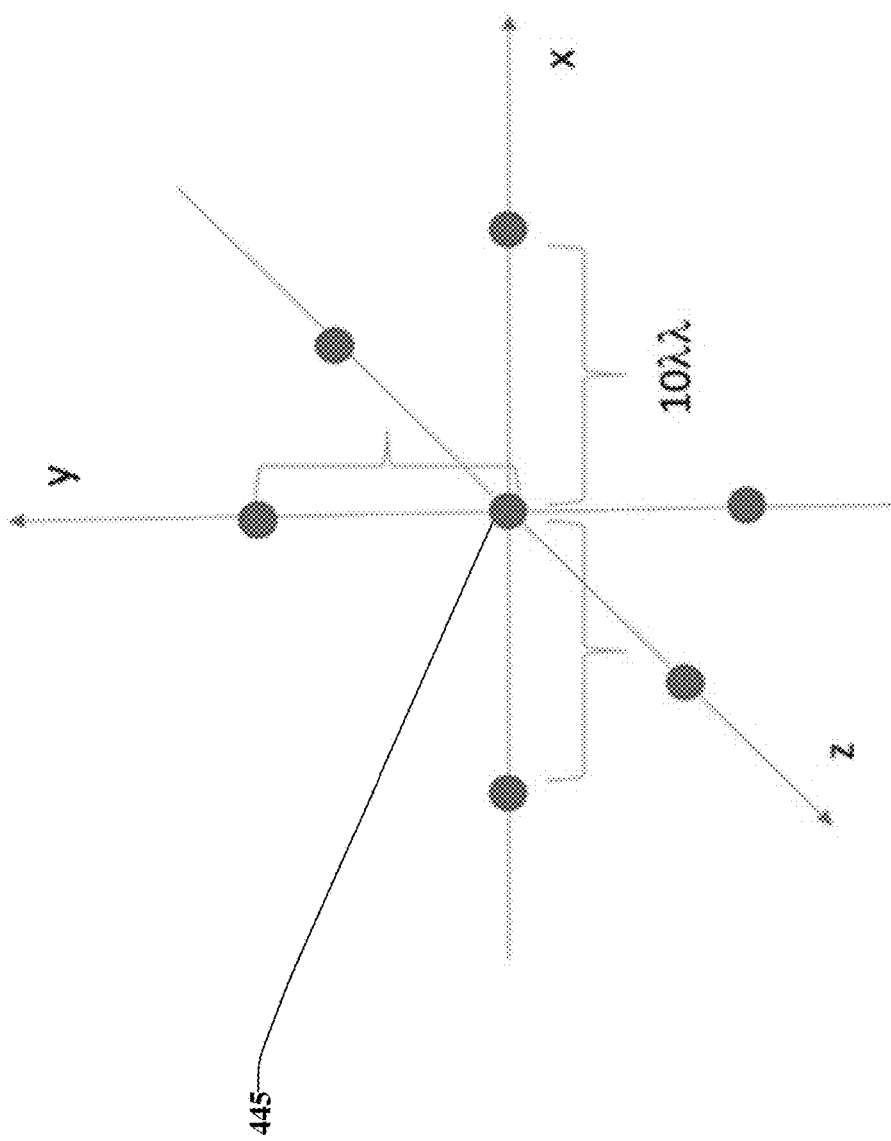
FIG. 4 Grid of Optimization Points

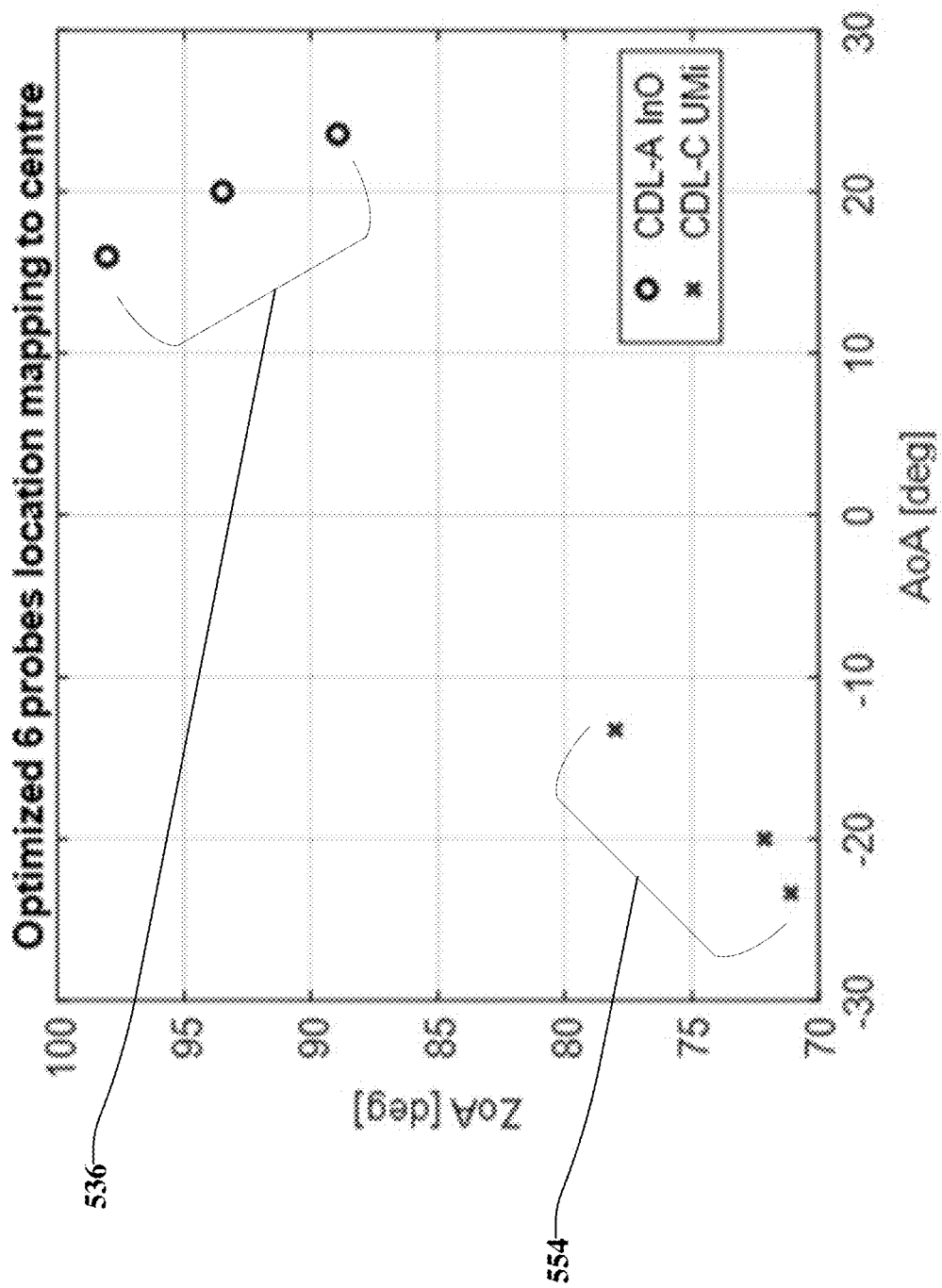
FIG. 5 Graphical Representation of the Probe Locations

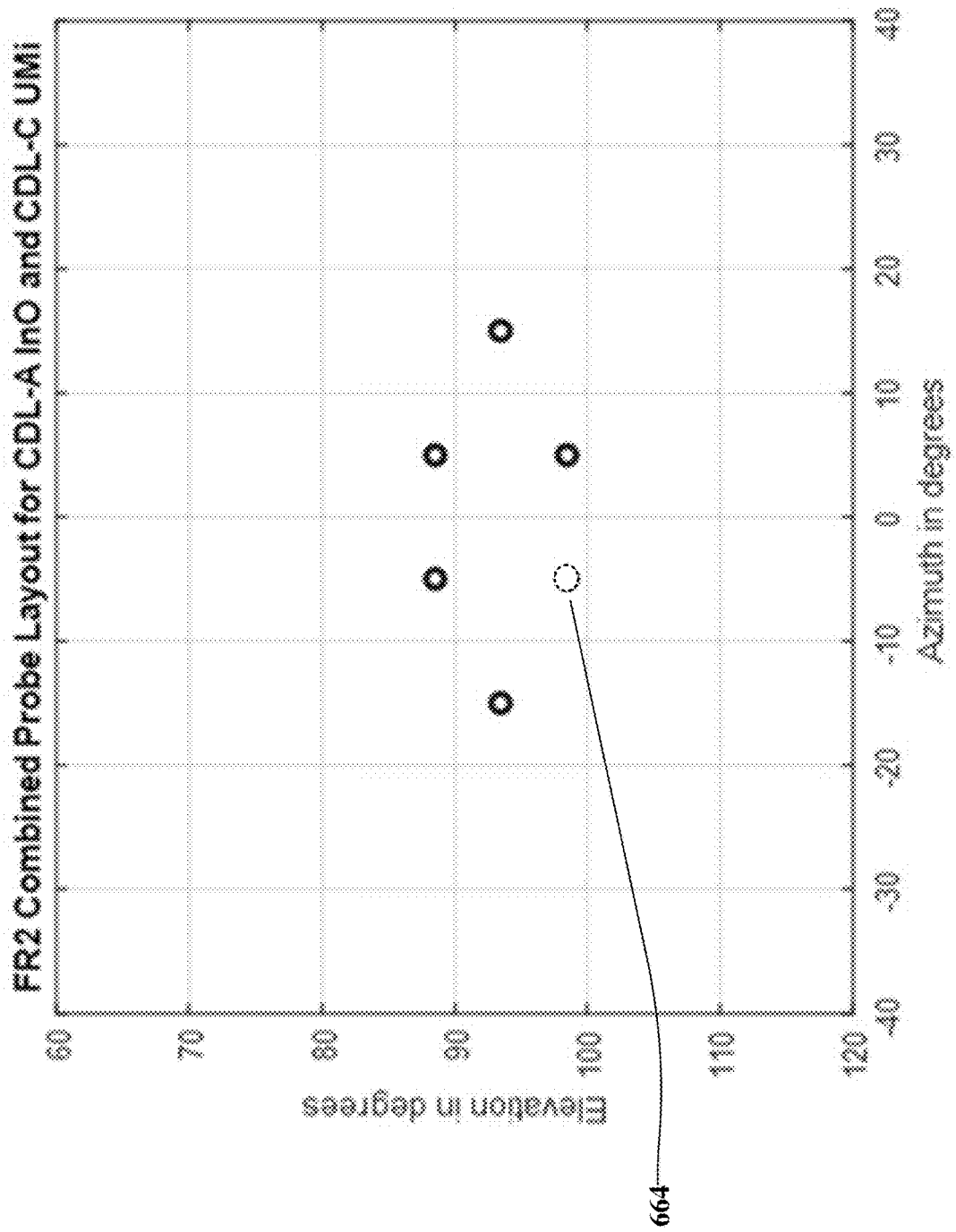
FIG. 6 Combined Probe Layout for CDL-A InO and CDL-C UMi

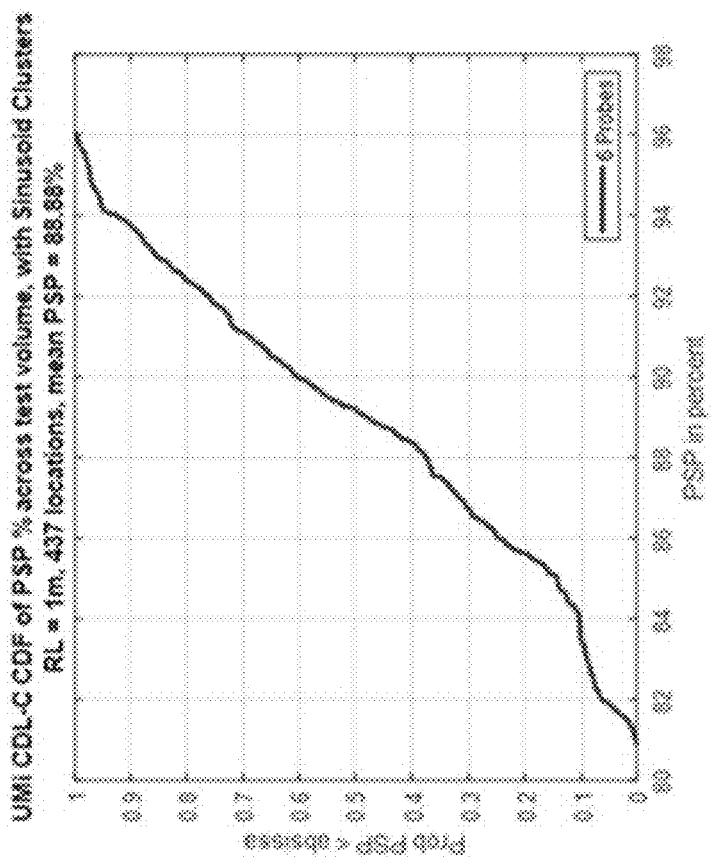
FIG. 7B UMi CDF of PSP at 1m Range Length
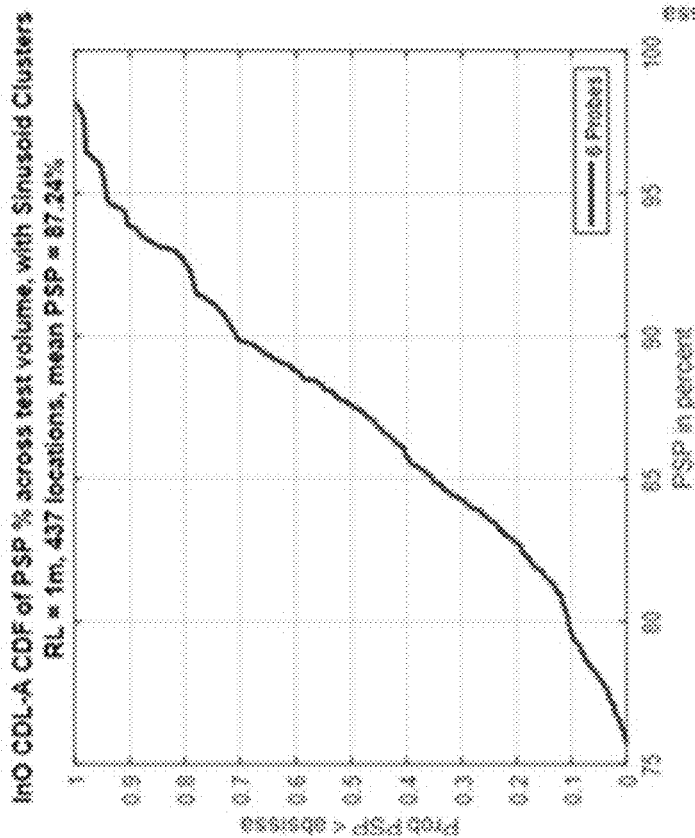
FIG. 7A InO CDF of PSP at 1m Range Length

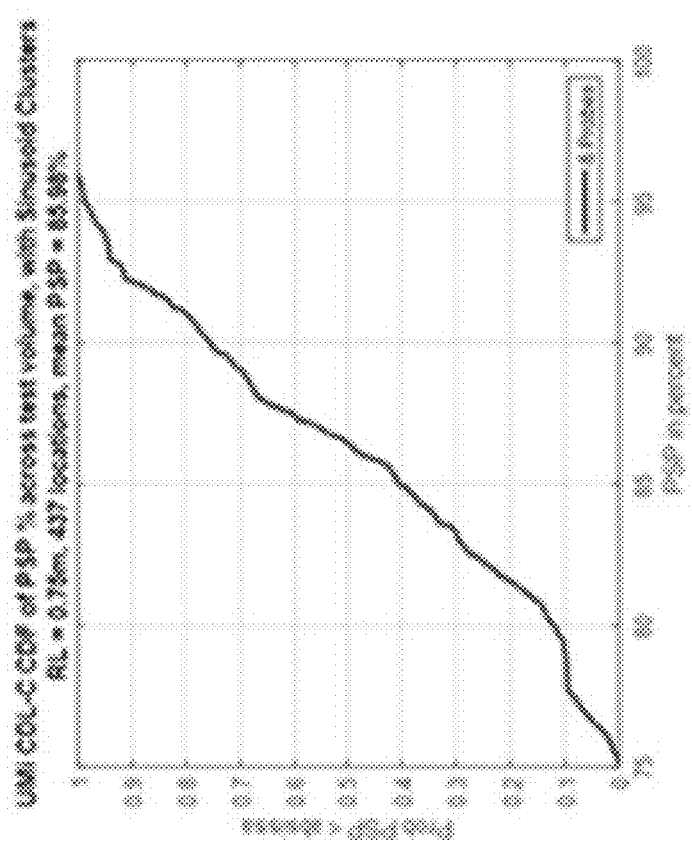
FIG. 8B UMi CDF of PSP at 75cm Range Length
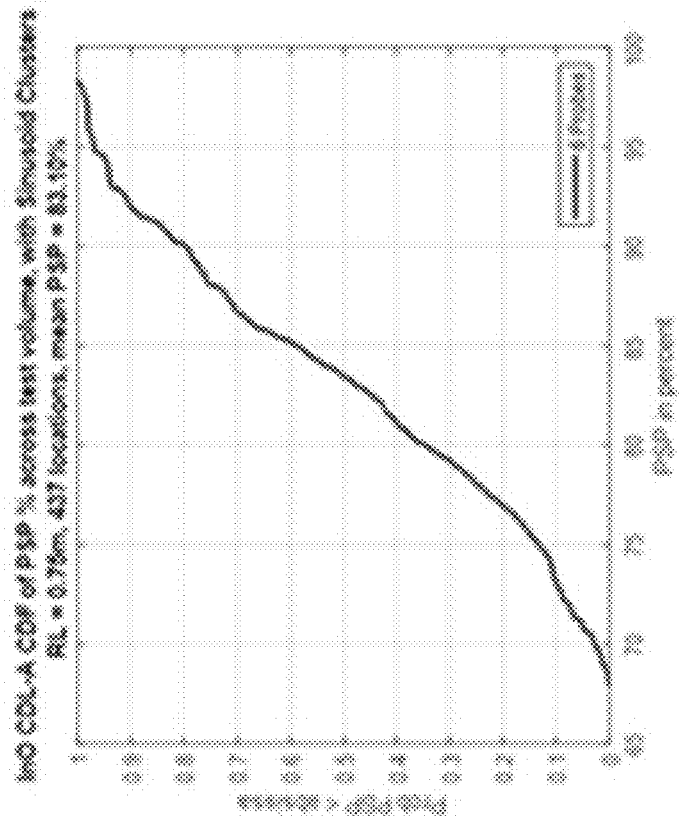
FIG. 8A InO CDF of PSP at 75cm Range Length

POSITIONING AND WEIGHTING TEST PROBES IN AN ANECHOIC CHAMBER

CROSS-REFERENCES

This application claims the benefit of U.S. Provisional Patent Application No. 62/976,340, titled "Locating and Weighting Test Probes in an Anechoic Chamber" filed on 13 Feb. 2020 and U.S. Provisional Patent Application No. 62/981,998, titled "Positioning and Weighting Test Probes in an Anechoic Chamber" filed on 26 Feb. 2020. The priority application(s) are hereby incorporated by reference herein for all purposes.

INCORPORATIONS

The following standard is incorporated by reference in this filing: "$3^{rd}$ Generation Partnership Project (3GPP); Technical Specification Group Radio Access Network (RAN); Study on Radiated Metrics and Test Methodology for the Verification of Multi-Antenna Reception Performance of NR User Equipment (UE); (Release 16)."

Also incorporated by reference is "5G MIMO OTA Testing on Frequency Range 2 (FR2)", by Jukka-Pekka Nuutinen, et al, URSI GASS 2020, Rome, Italy, 29 Aug.-5 Sep. 2020.

BACKGROUND

Pre-deployment testing of 5G antenna arrays presents new challenges, as higher frequency channels come into use, including FR1 (below 6 GHz) and FR2 (above 24 GHz). With the advent of 5G telecommunications, more and more devices will operate frequencies in the millimeter wave (mmWave) range. Each of these devices of various sizes and for different applications requires specific architectures and antenna sizes. The operation of these antennas needs to be validated by Over The Air (OTA) tests in an anechoic test chamber. This involves translating real world conditions into test models and then equipping an anechoic chamber to simulate test model conditions, for lab testing of 5G wireless technology.

SUMMARY

The technology disclosed addresses locating test probes within the anechoic chamber and weighting the probes. The key performance indicator of probe location and weighting is PSP (power angular spectrum (PAS) similarity percentage), which represents fidelity of the test environment to conditions being simulated. A key constraint of test probe placement is having a limited number of probes, such as 6 to 8 or to 16 or 32 probes. Probe count is limited by cost, including resources required to drive each probe, physical size of the probes, and required isolation or separation between probes. Since probes are dual polarized, signal fading is independent among probe elements and signal processing resource requirements are doubled.

Particular aspects of the technology disclosed are described in the claims, specification and drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1A illustrates beam response with a per element pattern at the base station, via a multipath signal for the Urban micro (UMi) CDL-C model at 28 GHz.

FIG. 1B illustrates beam response with a per element pattern at the base station, via a multipath signal for the indoor office (InO) CDL-A model at 28 GHz.

FIG. 2A shows the PSP power spectrum in the angular domain as a heat map that represents the way the test antenna sees the CDL-A InO channel model.

FIG. 2B shows the PSP that represents how the test antenna sees the CDL-C UMi channel model.

FIG. 3A shows the effect of probe count on the PSP in percent, across the test volume, for the indoor office InO CDL-A model with range length of 0.75 m.

FIG. 3B shows the effect of probe count on the PSP in percent, across the test volume, for the urban micro UMi CDL-C model with range length of 0.75 m.

FIG. 4 shows a grid of optimization points, with a DUT in the center.

FIG. 5 shows a graphical representation of the probe locations for optimized six probes mapping to center, for CDL-A InO model probes and CDL-C UMi model probes.

FIG. 6 shows an example combined probe layout for CDL-A InO and CDL-UMi for FR2 which illustrates probe installation as a combination of probes in a more concentrated domain with six antennas.

FIG. 7A shows a cumulative distribution function plot at 1 m range length for the InO model.

FIG. 7B shows a cumulative distribution function plot at 1 m range length for the UMi model.

FIG. 8A shows a corresponding cumulative distribution function plot for the InO model at 75 cm range length.

FIG. 8B shows a corresponding cumulative distribution function plot for the UMi model at 75 cm range length.

DETAILED DESCRIPTION

Figure 9:
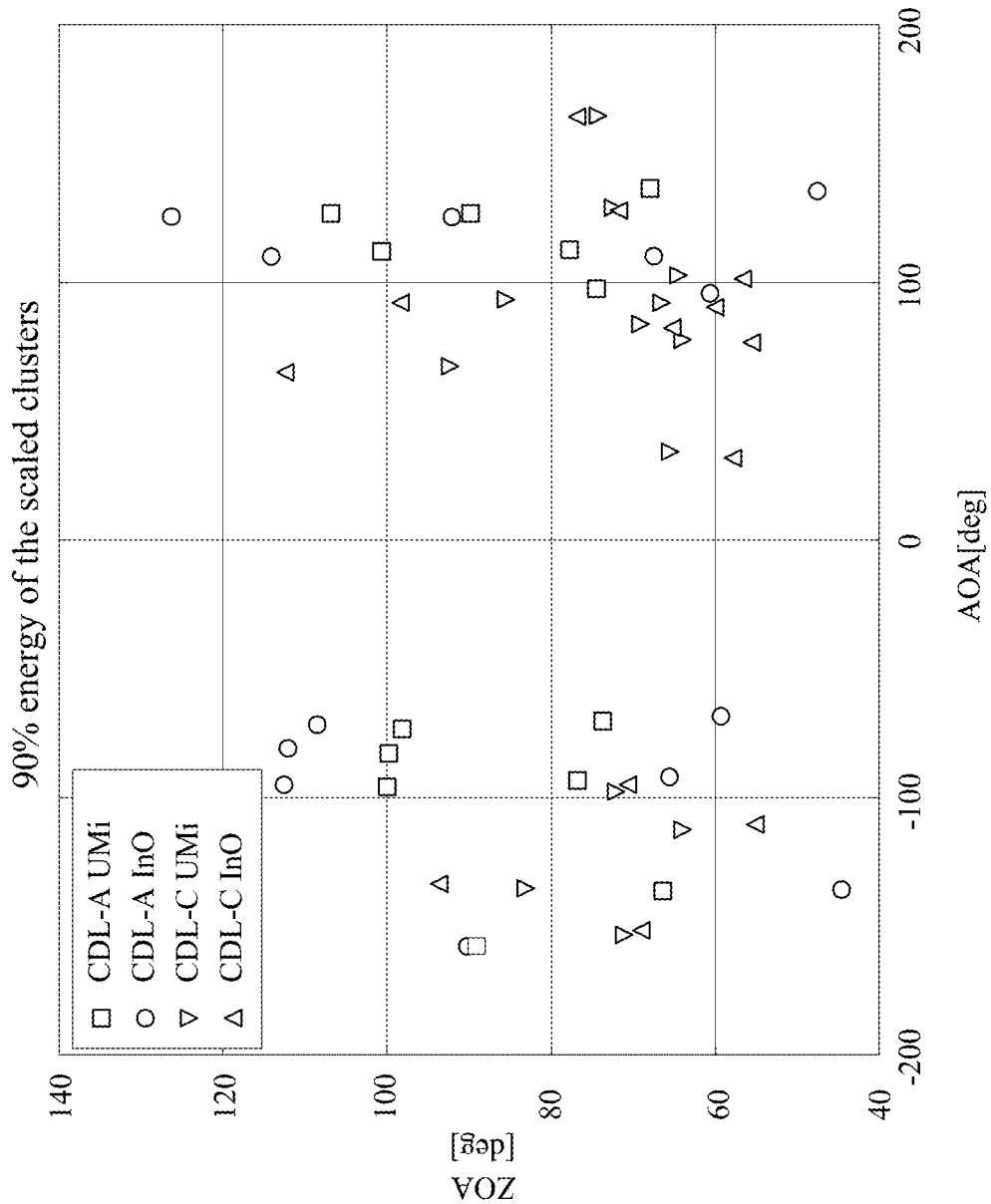
FIG. 9 shows a graph of energy of scaled clusters for the models CDL-A Umi, CDL-A InO, CDL-C Umi and CDL C InO.

The following description of the disclosure will typically be with reference to specific embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope. Those of ordinary skill in the art will recognize a variety of equivalent variations on the description that follows. Like elements in various embodiments are commonly referred to with like reference numerals.

The technology disclosed addresses locating test probes within the anechoic chamber and weighting the probes. The key performance indicator of probe location and weighting is PSP (power angular spectrum (PAS) similarity percentage), which represents fidelity of the test environment to conditions being simulated.

Acronyms

Acronyms used in this disclosure are identified the first time that they are used. These acronyms are terms of art, often used in standards documents. Except where the terms are used in a clear and distinctly different sense than they are used in the art, we adopt the meanings found in wireless standards. For the reader's convenience, many of them are listed here:

| | |
|---|---|
| AOA | Azimuth angle Of Arrival |
| AOD | Azimuth angle Of Departure |
| BS | Base Station |
| CDL | Clustered Delay Line |
| DUT | Device Under Test |
| FR | Frequency Range |
| GCM | Geometric Channel Modelling |
| gNb | Generalized Node B |
| InO CDL-A | Indoor Office Clustered Delay Line Channel Model A |
| KPI | Key Performance Indicator |
| MIMO | Multiple Input Multiple Output |
| MPAC | Multi-Probe Anechoic Chamber |
| NR | New Radio |
| OTA | Over The Air |
| PAS | Power Angular Spectrum |
| PSP | PAS Similarity Percentage (1-TVD)*100% 100% denotes full similarity; 0% denotes full dissimilarity |
| RL | Range Length |
| RTS | Radiated Two Stage |
| TVD | Total Variation Distance |
| UMi CDL-C | Urban Micro Clustered Delay Line Channel Model C |
| URA | Uniform Rectangular Array |
| ZoA | Zenith Angle of Arrival |

The technology discloses a system of replacing a single probe with a small array, e.g. a 4×4 planar array with 16 dual polarized elements, and using this small array to form a beam to provide a similar signal to the probe signal, while reducing the transmission loss to the center of the test volume. The system can also utilize a larger planar array that can replace more than one probe antenna and form more than one beam in the chamber to provide coverage to the test volume. Further the system can utilize probe arrays to emulate base station signals that may typically be formed in beams to evaluate UE performance.

The technology disclosed formulates an optimization problem for placement of a predetermined number of probes. The optimization problem is solvable by numerical methods, which can be focused by clustering heuristics. Clusters can divide the predetermined antenna group according to channel model, such as CDL-A and CDL-C models. Initial location for each cluster can be in a direction in which the strongest power output of an antenna being tested is directed. A center of mass of clustered antennas can be initially placed in the strongest beam direction of a model.

This approach can be applied, for instance, to placement within an anechoic chamber of 6 probes, clustered as 3 probes per scaled channel. Each probe is dual polarized, with two antenna elements, and is driven by appropriate test equipment. The first cluster is positioned with a center of mass in line with the strongest beam direction of the first scaled channel and the second cluster similarly positioned in line with the strongest beam direction of the second scaled channel. Within each cluster, placement of individual probes takes into account numerical solution of the optimization problem. Given physical characteristics of the anechoic chamber, placement within +/−1 or 2 or 3 degrees of spherical arc from the numerical solution suffices.

The disclosed technology further simplifies the test system by aligning the peak cluster directions. In this case, the probes can be placed in a smaller region, yielding simpler and more fabricable design of the wall probes. A fixed probe geometry having one or two additional probes or one or two fewer probes would also be possible, with a slight change in performance expected.

The disclosed new design for probe placement allows one to concentrate the probes into a small area that has the following benefits:

1. Allows a smaller chamber,
2. Easier to build a structure to hold the probes,
3. Shorter cable runs, so reduced RF loss, easier to control phase,
4. Single probe structure supports both channel models, and
5. Power distribution is in a good range, i.e. we avoid powers that are extremely low.

The rotational offsets used to align to the model clusters may be placed slightly off-center from the various probes such that the model cluster is closer to one probe than another for these symmetrically spaced probes. This off-centered approach results in improvement of the power weights and yields an improved match for PSP for the delta between the model and the emulation. The mathematical description of the process for finding probe locations and probe weights is delineated in detail later in this document. System design is summarized next.

System Design and Probe Layout for FR2 MPAC MIMO OTA

Urban micro (UMi) CDL-C and inside office (InO) CDL-A channel models are used for radiated performance evaluation of frequency range two (FR2) multiple input multiple output (MIMO) devices in multiprobe anechoic chamber (MPAC) over the air (OTA). For FR2 testing, RF test sources deliver the RF signals at a frequency of 24.25 GHz to 52.6 GHz, with systems typically deployed at 24.25 to 43.6 GHz. Additional frequencies at which signals are delivered for FR2 testing include 52.6 GHz to 71 GHz. The models are filtered by gNb base station antenna in the spatial domain to practically form spatially single cluster models if proper power threshold cut is performed to filtered channel model. The threshold is generally set as dB value to down from peak value.

FIG. 1A shows the strongest beam response with a per element pattern at the base station (BS), via a multipath signal for the Urban micro (UMi) CDL-C model at 28 GHz. When the gNb array is applied, the energized signal is illustrated with circular symbols with relative power level in dB versus delay in Taps, alongside the isotropic signal depicted with square symbols. The beam forming puts the signal out in the strongest direction, so circular symbols show the clusters energized after gNb filtering.

FIG. 1B shows the strongest beam response with a per element pattern at the base station (BS), via a multipath signal for the indoor office (InO) CDL-A model at 28 GHz. For this model, when the gNb array is applied, a single cluster is dominate as illustrated with circular symbols with relative power level in dB versus delay in Taps. The isotropic signal is depicted with square symbols. The beam forming puts the signal out in the strongest direction, so circular symbols show the clusters energized after gNb filtering, for the InO CDL-A model.

When the powers are sorted and the three strongest clusters are investigated, the following powers are determined.

TABLE 1

Strongest Clusters

| Model | 3 Strongest Clusters | Power 1 (dB) | Power 2 (dB) | Power 3 (dB) |
|---|---|---|---|---|
| CDL-A InO | 2, 3, 5 | 23.9573 | −32.0115 | −35.9285 |
| CDL-C UMi | 4, 2, 1 | 23.0401 | 5.8506 | −5.3172 |

The powers show that CDL-A InO is a single cluster model, while CDL-C UMi has two significant clusters. Examining clusters' AoA/ZoA information of CDL-C, we note that clusters 4 and 2 represent the same spatial cluster. The cluster 1 in CDL-C is a separate spatial cluster, however it is 28.3 dB lower in power. Therefore, we can neglect that from the treatment.

FIG. 2A shows the PSP power spectrum in the angular domain as a heat map that represents the way the test antenna sees the CDL-A InO channel model. As UE test antenna, typically we use 4×4 antenna, with 0.5 lambda separation between elements. FIG. 2A shows the PSP as calculated from the down selected model @RL=75 cm with the strongest direction plotted. RL=75 cm is selected as a good compromise between size and performance.

FIG. 2B shows the PSP that represents how the test antenna sees the CDL-C UMi channel model. As UE test antenna, typically we use 4×4 antenna, with 0.5 lambda separation between elements. FIG. 2B shows the PSP as calculated from the down selected model @RL=75 cm with the strongest direction plotted.

In FIG. 2A and FIG. 2B, the strongest signal direction is marked with a green circle 244, 264. Strongest signal should be the main direction that is illuminated by the test system. Thus, the strongest signal direction is the center of cluster to be modelled. Location of the circle of strongest beam directions is tabulated next.

TABLE 2

Strongest Beam Directions

| Channel Model | Scaling | AOA | ZoA |
|---|---|---|---|
| CDL-A | InO | 20 | 93.5714 |
| CDL-C | UMi | −20 | 72.1429 |

This also implies that wall design should fit into approximately 40 degrees×21.4 degrees panel. These directions are the main directions from where the UE can observe signal to arrive. Therefore, we can take these angles as center of mass and find additional probes around the center of mass. There are two considerations to make: 1) what are the optimal probe locations and 2) what are the optimal probe weights.

FIG. 3A shows the effect of probe count on the PSP in percent, across the test volume, for the indoor office InO CDL-A model with range length of 0.75 m (75 cm). FIG. 3B shows the effect of probe count on the PSP in percent, across the test volume, for the urban micro UMi CDL-C model with range length of 0.75 m (75 cm). Both FIG. 3A and FIG. 3B illustrate that PSP can be improved by adding probes. The PSP has lower value in boundaries of test zone; however, it is observable that the biggest gain of PSP is obtained when the number of probes is increased from 1 to 3. If the probe count per channel model is greater than 3, there is practically no improvement of PSP.

The PSP can be set such that the whole test zone (or test volume) is covered. One technique is shown in "On Radiated Performance Evaluation of Massive MIMO Devices in Multiprobe Anechoic Chamber OTA Setups", by P. Kyosti, L. Hentila, W. Fan and M. Latva-aho, IEEE Trans. on antennas and Propagation, Vol. 66, No. 10, October 2018. Simulation results of optimized weights and probe locations with corresponding PSP number after 10 iterations are shown later in this document. PSP can be slightly better with different settings, but likely not more than 2%, based on the completed simulations.

FIG. 4 shows a grid of optimization points. The PSP is calculated totally in 7 positions in test volume, 6 on the boundaries and one in center 445. This selection is done intentionally to weight more on the low PSP values. As seen from FIG. 3A and FIG. 3B, the PSP tends to be lower in the boundary and calculating in these points we can gain most of the weight and probe placement optimization. The probe locations and corresponding mean PSP calculated over the optimized points for the two models are listed next.

TABLE 3

Probe Locations and Corresponding Mean PSP
Channel Model CDL-A InO

| Probe Az | | | Probe El | | | |
|---|---|---|---|---|---|---|
| 1 | 2 | 3 | 1 | 2 | 3 | Mean PSP |
| −20 | 23.5515 | 15.9853 | 93.5114 | 88.9604 | 98.072 | 84.77 |

Channel Model CDL-C UMi

| Probe Az | | | Probe El | | | |
|---|---|---|---|---|---|---|
| 1 | 2 | 3 | 1 | 2 | 3 | Mean PSP |
| −20 | −23.3704 | −13.2601 | 72.1429 | 71.0986 | 78.0166 | 82.38 |

FIG. 5 shows a graphical representation of the probe locations for optimized six probes mapping to center, with an x axis of AoA in degrees and y axis of ZoA in degrees: CDL-A InO model probes 536 and CDL-C UMi model probes 554.

Thus, with totally 6 probes we can have better than 82% PSP, even with large spread of signals. Zenith of Arrival (ZoA) is a measure of the elevation angle. If the channel model has a ZoA that is too high a value of vertical angle, then the entire channel model can be tilted down so that it aligns with the probes that are being used to model that channel model. In this case, the ZoA axis looks like the signal is coming from the top. Therefore we can rotate the ZoA axis by 60 degrees, so that the signal arrives above the bore sight.

The positions in FIG. 5 are outputs of the optimization, thus they may be difficult to position to a probe system. Thus, in order to make something fabricable in real life, we propose that a) channel models are rotated and b) probes are grouped to symmetric form. As seen from FIG. 5, the probes form/and \shapes, thus one potential construction is a 'diamond' type installation with six probes. As described elsewhere, five probes can be used.

FIG. 6 shows a combined probe layout for CDL-A InO and CDL-Umi for FR2, with Azimuth in degrees by elevation in degrees, which illustrates that the probe installation is a combination of earlier probes, in a more concentrated domain with six antennas. The probe array functions to model the original channels by optimizing only the weights. FIG. 6 assumes that UE is staying in fixed position, i.e. two channel models are seen as separate models. Equivalently, we can rotate the UE, i.e. CDL-A InO yields position A and CDL-C UMi position B of the UE. In this way we can move the probes to same area, simplifying the probe layout considerably.

Even though the layout shown in FIG. 6 is not considered as optimized locations, we can still improve the probe weights to obtain adequate PSP level.

TABLE 4

PSP for FIG. 6 Probe Layout

| PSP % | Channel Model | |
| --- | --- | --- |
| RL | CDL-A InO | CDL-C UMi |
| 1 m | 87.24% | 88.88% |
| 75 cm | 83.10% | 85.98% |

The FIG. 6 probe layout is sufficient to test FR2 beam-former devices. We have used partial optimizing, fixing the locations but optimizing the probe weights. The mean PSP numbers for FIG. 6 probe layout listed in Table 4 are slightly different than the values in Table 3, due to longer optimization time and different positions of the points at which mean PSP is calculated. Table 3 represents the worst-case estimate, and Table 4 best case estimate in which sampling is done also in interior points. Note that weight only optimization yield good PSP numbers. Location optimization of probes shown in FIG. 5 indicates how probes can be allocated, for example. FIG. 6 illustrates that the combined probe layout can be sufficient with five of the probes, without the probe listed for azimuth −5 and elevation 88.5. 664.

If the channel model rotation is applied and structure of probes is regular, the PSP can be over 83%. Grid points of FIG. 6 are listed in Table 5.

TABLE 5

Probe Layout Shown in FIG. 6
Probe Locations

| Azimuth | −15 | −5 | −5 | 5 | 5 | 15 |
| --- | --- | --- | --- | --- | --- | --- |
| Elevation | 93.5 | 88.5 | 98.5 | 88.5 | 98.5 | 93.5 |

If the channel model is rotated, the size of the wall shrinks. In azimuth the spread is 30 degrees and in elevation 10 degrees. That is, the spacing in azimuth is 10, 20, and 30 degrees, and the spacing in elevation is 5 and 10 degrees. These values are compatible with the RMS angle spreads, wherein the probe spacings in the corresponding azimuth or elevation domains are around 2*cASA and 2*cZSA, although the exact scaling can vary. By being in this range, it is straightforward to emulate the actual angle spreads by adjusting the relative power levels or "weights" on the probes. Taking a bit heuristic way to allocate probes, and optimizing the weights, the size of the wall shrinks to az=30 spread and el=10 degrees spread.

FIG. 7A shows a cumulative distribution plot at 1 m range length for the InO model, with mean PSP=87.24% with RL=1 m, for 6 probes. FIG. 7B shows a cumulative distribution function plot at 1 m range length for the UMi model, with mean PSP=88.28% with RL=1 m, for 6 probes. FIG. 8A shows a corresponding cumulative distribution function plot for the InO model at 75 cm range length. FIG. 8B shows a corresponding cumulative distribution function plot for the UMi model at 75 cm range length. It can be seen that it is harder to get high PSP value at 75 cm, yet the link budget gets better and chamber size smaller. The PSP is consistently over 83% even at shorter range length, as shown in the PSP results listed in Table 4.

The disclosed FR2 MPAC MIMO OTA system layout for the InO and UMi models can be implemented with three probes per channel model. Six probes is sufficient to implement both models and better than just four probes. A regular grid of probes can be positioned with at least four or five of the six probes in a hexagon-like pattern that is wider than it is tall and missing vertex(es) when there are fewer than six probes. Candidate positions for six probe are listed in Table 3. The device under test in the chamber can be oriented relative to the regular grid of probes using the strongest beam directions listed in Table 2 for each channel model. A combination of probes may appear to the device under test to be a single probe, given the aperture of the DUT. This allows weighting of signals on the combination of probes to cause an apparent position of a base station to appear to move, without changing orientation of the DUT.

The mathematical description of the FR2 MPAC system design process for finding probe locations and weights is described next.

Mathematical Description of the FR2 MPAC System Design

Described is a process for finding probe locations and probe weights. Initial simulations show that one can easily improve 4% of the PSP in only a few steps. The key idea is to maximize the PSP seen by UE in a given channel model. Channel model, after the gNb filtering, is very sparse in spatial domain and this fact is used to improve the probe locations with reasonable cost.

Currently, 3GPP defines the 5G NR FR2 test solution. The biggest hurdle is the probe layout and count. We define the mathematical framework to define the system design. The 3GPP 5G NR FR2 test system includes a network emulation system such as a gNb emulator to mimic the base station in the field, a fading emulation system such as a channel emulator to mimic the environment, a frequency converter and power amplifiers to convert the signal up/down into appropriate frequency, and an anechoic chamber for device under test (DUT) placement.

Radio signals propagate through air and are distributed in time frequency and space. Depending on the environment (dense urban, rural, indoor), the distribution of propagation paths is different. The environment dynamically changes as reflections are initiated from moving objects, such as moving vehicles. We map the propagation environment to the anechoic chamber of the test system described above, after determining how to map the desired channel model to the UE's experienced local environment, so that the probe antennas in the chamber can be placed for the desired conditions for the UE experience. Practically, the number of probes is limited and therefore a mapping algorithm can be used to locate the probes, and weight them, such that limited resources are used well. Next we describe the mathematical framework to do this and ways we can find better quality of the mapping with reasonable processing time.

In determining probe locations,

KPI=Key Performance Indicator, which is a parameter that is used as a quality metric.

Arg=an operator which gives the argument of a function, such as arg f(x)=x. PSP is calculated by (1−TVD)*100%.

TVD=total variation distance.

The TVD is calculated by the power normalized difference in antenna response using a predefined test array. The difference is calculated for each azimuth and elevation and summed and the sum is divided by two since the two terms making up the difference are both unity resulting in a maximum value of two, yielding a possible range of values from zero to one.

The KPI to measure in FR2 is PSP (PAS similarity percentage). It represents what UE sees as power angular spectrum in test volume of the chamber. We have observed that in a single point (i.e. in center) the PSP is same no matter what the range length is. If the calculation point is changed, the PSP starts to diverge and the larger the range length, the better we can get the same value of PSP in boundary as in center. The target of the improvement is to find a) improved position of the probes and b) improved weights of the probes, in a case when range length is limited, and probe count is limited. Thus, with a given probe count and given range length, we can formulate the optimization problem to find where the probes are located and what are the weights, i.e.:

$$(r_o, w_o) = \arg\left(\max_{k,l}\left(\sum_{i=1}^{N} PSP_i(r_k, w_l, m_j)/N\right)\right) \quad (1)$$

where $(r_o, w_o)$ are improved location and improved weights. N is the number of points in the test volume, and PSP is calculated with multiple probe positions and weights, indexed k. Variable m refers to channel models, and j=1, 2 referring to CDL-A InO and CDL-C Umi, respectively.

In equation (1) inner brackets calculate with given weight and location combination mean PSP over the test volume. Second bracket runs through k values of probe locations and l weight combinations. Once we find probe location and weight combination that produces largest PSP in a given channel model, the PSP arguments, i.e. probe location and weight vector is the improved solution for (1).

Equation (1) needs to be constrained in practice by the minimum distances between the probe antennas. There is physical limitation due to a) size of the probe and b) required isolation. On each probe, we make condition that the distance to neighboring probe antennas is greater than probe radius plus needed air isolation, s. The distance is calculated as (in 3D cartesian co-ordinate system)

$$d_i = \sqrt{(x_i - x_m)^2 + (xy_i - y_m)^2 + (z_i - z_m)^2}, m \neq k$$

Also, the weights are normalized. That is, sum of all probe weights is 1. The minimum weight for a probe may be constrained, such that a minimum may be set to a predefined value, such as. 1%. This could be done to maintain the test signals to be above a certain noise level or have a certain margin in the test system.

$$(r_o, w_o) = \arg\left(\max_{\substack{k,l \\ d_k \geq \varepsilon}}\left(\sum_{i=1}^{N} \frac{PSP_i(r_k, w_l, m_j)}{N}\right)\right), \sum_{k=1}^{M} w_k = 1 \quad (2)$$

Where M is number of the probes in given channel model.

We also know that the number of probes is limited by fading solution resources R, which yields the final limitation:

$$(r_o, w_o) = \arg\left(\max_{\substack{k,l \\ d_k \geq \varepsilon}}\left(\sum_{i=1}^{N} \frac{PSP_i(r_k, w_l, m_j)}{N}\right)\right), \sum_{k=1}^{M} w_k = 1, k \leq \frac{R}{2} \quad (3)$$

All probes are dual polarized, and each polarization requires its own fading resource as fading is independent in polarization domain.

N is used to sample the test volume. This means that improvement cannot be done in a single point in the test volume, rather trying to find an average of multiple locations.

It is known that in single point of the test volume we can reach very good agreement of PSP with various range lengths, thus it is necessary to calculate PSP in multiple points in test volume.

Using a grid of optimization points, the center and six points on the boundary of the test volume are selected to produce the worst possible PSP to be improved. It is assumed that the PSP is better inside the test volume, and not at the boundary. Equation (1) cannot be resolved in closed form. Thus we use a numerical method to solve the equation, utilizing the following steps:
 a. Fix the RL,
 b. Fix the Probe count,
 c. Calculate combinations of weight and probe locations PSP,
 d. Find maximum PSP, and
 e. Find corresponding w and r to be improved solution.

As this process can be very time consuming as whole space and all probe weights, this is not the way to efficiently solve this equation, so we identify an improved allocation method. In FR2, the gNb antenna filters the clusters heavily. Therefore, most of the space to locate the probes will yield very low PSP values. The probe location can be started by setting the probe into strongest power direction.

Using a model of the gNb antenna, after being steered to the strongest path that departs the base station and arrives at the UE terminal, the beam is aligned to the cluster elements or sub-paths of the cluster. Other paths are not energized with the main beam and will therefore be much weaker. Thus only one strong path is observed at the UE in this example.

FIG. 2A and FIG. 2B depict the PSP calculated using the hypothetical 4×4 UE antenna in the chamber. For the two channel model examples shown, we have a probe in [20,93] and one probe in [−20, 72] degrees, directions that correspond to the strongest path arriving at the UE when the spatial filtering at the gNb has been applied. Next, to yield a search space that is highly reduced, we limit the search space by applying the following assumptions:
 1. The additional probes are within a circle around the strongest seen direction. Circle radius is N degrees.
 2. The total number of probes is limited to 6-8.

The two-dimensional max search in a given channel model can be further simplified by separating the weights and locations as they are loosely connected together. Numerically, it is much faster to first find locations by finding max PSP with probe locations and then the weights. Thus, equation (3) can be written piece wise (for simplicity we leave the conditions from (3) out, yet they apply like Eq. (3)).

$$(r_o, w_f) = \arg\left(\max_{k}\left(\sum_{i=1}^{N} PSP_i(r_k, w_f, m_j)/N\right)\right)$$

$$(r_f, w_o) = \arg\left(\max_{l}\left(\sum_{i=1}^{N} PSP_i(r_f, w_l, m_j)/N\right)\right)$$

Thus,
1. Search with given weights probe locations within the reduced search region to get probe locations (probes 3, . . . , N, N=6, 7, 8)
2. Fix the probe locations and search the weights for fixed probe locations from step 1 by searching such that strongest weight is allocated to probes 1 and 2.

Using this approach, the number of combinations to be calculated is greatly reduced, yielding reduced processing time to maximize the PSP seen by UE in a given channel model.

The test system can be further simplified by aligning the peak cluster directions, with the probes placed in a smaller region yielding simpler and more fabricable design of the wall probes. One example is listed in Table 6, following angular shifts applied to each of the models:

TABLE 6

Shifted Probe Layout

| Model | Azimuth shift | Elevation shift |
|---|---|---|
| CDL-A InO | −20 | −1 |
| CDL-C UMi | 17 | 18 |

The outcome of these shifts is that wall structure of the test system becomes more concentrated, but at the same time the DUT can be rotated as well to compensate for the channel model rotation. The optimization can create a system that yields a very difficult probe layout to install and maintain (cabling, minimum distance between probe antennas). Thus, one idea that is also inherent to this application is that after the channel model rotation, fixed positions of probe antennas are used and only weights are optimized, as described relative to FIG. 6 earlier in this document.

FIG. 6 shows the probe layout geometry shared between the two models by adding the rotations as indicated. The spacing is set substantially according to the angle spread values, where cASA is the cluster azimuth spread of arrivals, which defines the spread of planewave sinusoids modeling the azimuth domain, and cZSA is the cluster zenith spread of arrivals modeling the spread of planewave sinusoids modeling the elevation domain. The same planewave sinusoid is a component of the spread in the elevation and azimuth.

TABLE 7

Cluster ASA and Cluster ZSA for Models

| Model | cASA | cZSA |
|---|---|---|
| CDL-A InO | 6.4975 | 2.0933 |
| CDL-C UMi | 10.4021 | 4.8814 |

The spacing in azimuth is 10, 20, and 30 degrees, and the spacing in elevation is 5 and 10 degrees. These values are compatible with the RMS angle spreads, wherein the probe spacings in the corresponding azimuth or elevation domains are around 2*cASA and 2*cZSA, although the exact scaling can vary. By being in this range, it is straightforward to emulate the actual angle spreads by adjusting the relative power levels or "weights" on the probes.

The channel model parameters and probe locations for channel model implementation are defined in a channel model coordinate system. The layout of the fixed probe geometry can vary, wherein the position of the probes might be adjusted such that the triangles might be reversed, so the current < > style might be replaced with > <, or the centre might be straight with |--| or slanted with |/| or |\|, and a similar behaviour after optimizing the weights would be expected. A fixed probe geometry having one or two additional probes, or one or two fewer probes is also possible, with a slight change in performance expected.

The disclosed design includes using the probes for each channel model and moving the channel model so that strongest response is aligned to the location of the set of probes. The design also includes obtaining an optimized result for each channel model vs probe layout, which also includes weighting the average power per probe uniquely for each channel model being compared.

A study of the sensitivity of the system design, especially UE position sensitivity to the PSP numbers, for the CDL-A and CDL-C models at 28 GHz carrier frequency is described next.

Sensitivity of PSP to UE Position in Test Volume

The sensitivity of the system design has been studied to identify how much the PSP vary if the UE antenna is offset from the original position. Essentially, the target of the test volume should be that PSP is constant, or within acceptable variation level within the test volume.

The simulations were done using a BS 8×16 dual polarized antenna array and a MS 4×4 antenna configuration in gNb and UE, respectively. In simulation, the UE antenna was moved to offset and determine the PSP in given offset positions. Table 8 presents the simulation results at 75 cm range length. Variation depends on the range length because the signal varies in a periodic and predictable pattern.

TABLE 8

Simulation Results at 75 cm RL

| | Channel | | Offset | | | | |
|---|---|---|---|---|---|---|---|
| RL | Model | Scaling | 0 | 10 L | 20 L | 30 L | 40 L |
| 75 cm | CDL-A | UMi | 90.56% | 85.745 | 80.23% | 79.00% | 75.24% |
| | | InO | 90.25% | 89.79% | 81.43% | 70.94% | 61.64% |
| | CDL-C | UMi | 81.08% | 78.59% | 76.23% | 75.25% | 74.76% |
| | | InO | 84.38% | 83.02% | 82.34% | 81.91% | 81.45% |

Based on the applicant's calculations in the table above, PSP remains within ~5% window if the UE is moved 10 lambda away from center, with lambda representing wavelength, which for 28 GHz, lambda=1 cm. There is a difference between how channel models behave when the UE is moved. CDL-A has a steeper decrease of PSP than CDL-C vs. offset value. Based on these observations, we can conclude that the PSP remains relatively constant if the UE is moved 10 lambda from original position which would yield that test volume is reasonable size if constant PSP is selected as metric to define the test volume. However, it is unknown how much variation of PSP is tolerated in real life. If the black box approach is taken to qualify the UE, we do not know where exactly the antenna array in UE is located, thus we can accept some variance on system metric, meaning how much PSP can vary in test volume between two different UEs due to different array locations.

The PSP calculation is typically made with a 4×4 test array to compare the response of the original channel model to the multi-probe model. The PSP gives a quality indication from 0 to 100% of how well the multi-probe model matches the original, with 100% being a perfect match. The center of the test volume in the chamber is the location that is normally optimized to obtain a high PSP value. When moving away from the center, the angles and distances to each probe changes, which impacts the PSP. The sensitivity to change is indicated by how much the PSP changes with distance from the center of the chamber.

Since each channel model has a different set of probe powers, the impact of changing locations of a device in the chamber results in a different response; so the sensitivity to PSP with distance from the center of the chamber is unique for each channel model.

PSP of 80% or higher is considered good to define the relationship between PSP quality and the impact on OTA data rate or throughput that is achievable at a device under test. So for a given test case, varying of PSP by 5-10% is considered acceptable and is expected to have little impact on the testing.

A study of channel model scaling and implements a cost effective MPAC system to test FR2 user devices, for the CDL-A and CDL-C models is described next.
Background on the Probe Layout on FR2 MPAC Systems R4-1906949 7pp (#734668) Filed in Prov 2/26

The study describes probe layout and design principles, focusing on the CDL-A and CDL-C models at 39 GHz carrier frequency, even though frequency does not play any role in this study. The results can be generalized to 28 GHz as well. Scaling is either UMi or InO. The range length (RL) is selected to be 75 cm on the simulations. This study uses the MPAC system based on a wall of probes structure to allow the creation of 3D channel models in an anechoic chamber, where a certain number of radiator antennas, also referred to as probes, are distributed in space. These antennas are used to transmit signals from a gNb through the channel model, filtered by the gNb antenna.

Since the purpose of the metric in FR2 is to test UE beamformer, the first natural approach is to define how many resources are needed to reconstruct the PAS (Power angular spectrum). Essentially, how we can accurately create the intended power distribution in space. 100% of power (or energy) would yield too many clusters to be distributed, yielding a test set up that is too complex. Viewing Table 9 of the percentage of energy distributed in space, it is observable that even though the channel model has either 23 or 24 clusters, over 90% of the energy is in 17 clusters. If the AoA/ZoA of these clusters is plotted, the following AoA-ZoA distribution is seen.

TABLE 9

Energy Distributed in Space for Models with Many Clusters

| Model | #Clusters | Percentage |
|---|---|---|
| CDL-A UMi | 17 | 90.67% |
| CDL-A InO | 17 | 90.67% |
| CDL-C UMi | 17 | 90.26% |
| CDL C InO | 17 | 90.26% |

FIG. 9 shows a graph of energy of scaled clusters for the models CDL-A Umi, CDL-A InO, CDL-C Umi and CDL C InO. By visual inspection of FIG. 9, the signal spreads from −180 degrees to +180 degrees, even if the scaling is done. In elevation one can see signals between +40 to 124 degrees. The spread of the signal is wider in the azimuth domain than in the elevation domain. If the signal is not filtered, 90% of the energy yields a very big installation. There are no clusters in middle (azimuth from −70 deg to 20 deg). Clusters are wrapped with 180 degree and −180 degree. If zero azimuth is boresight, the signals enter from back. These observations indicate that it is desirable to have a wider azimuth spread than the elevation for the design of the probes.

For the study, applying the 8×16 uniform rectangular array (URA) antenna to clusters, the spatial domain was filtered. Some clusters were amplified and some not.

Figure 10:
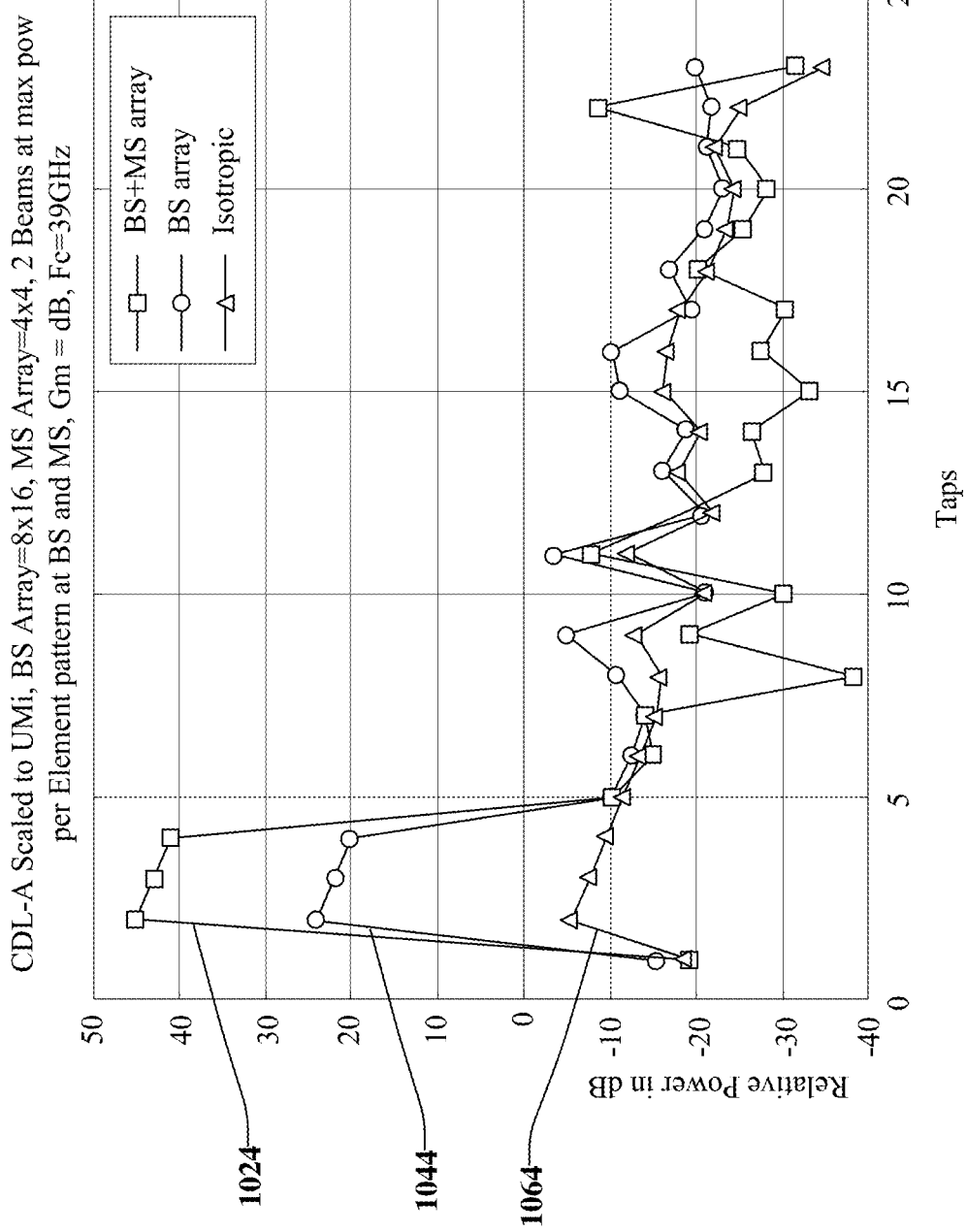
FIG. 10 shows the example CDL-A scaled to UMi, for a BS array of 8×16 and MS array 4×4, 2 beams at maximum power per element pattern at BS and MS.

FIG. 10 shows the example CDL-A scaled to UMi, for a BS array of 8×16 and MS array 4×4, 2 beams at maximum power per element pattern at BS and MS, with Gm=8 dB and center frequency Fc=39 GHz. The combination of BS and MS array 1024 shows the highest relative power in dB. The BS array results 1044 show the next higher relative power in dB, while the isotropic 1064 shows less than zero dB of relative power. The following table lists the number of clusters needed to model more than 90% of the energy.

TABLE 10

Clusters Needed to Model 90% of Energy

| Model | #Clusters | Percentage |
|---|---|---|
| CDL-A UMi | 3 | 90.38 % |
| CDL-A InO | 3 | 98.91% |
| CDL-C UMi | 7 | 92.23% |
| CDL C InO | 3 | 91.83% |

In the spatial domain, antenna filtering reduces the clusters to a maximum of six spatial clusters, AoA-ZoA. Multiple antennas are useable to model the equivalent spread of a cluster. Each of the original clusters are Laplacian in azimuth and elevation.

Figure 11:
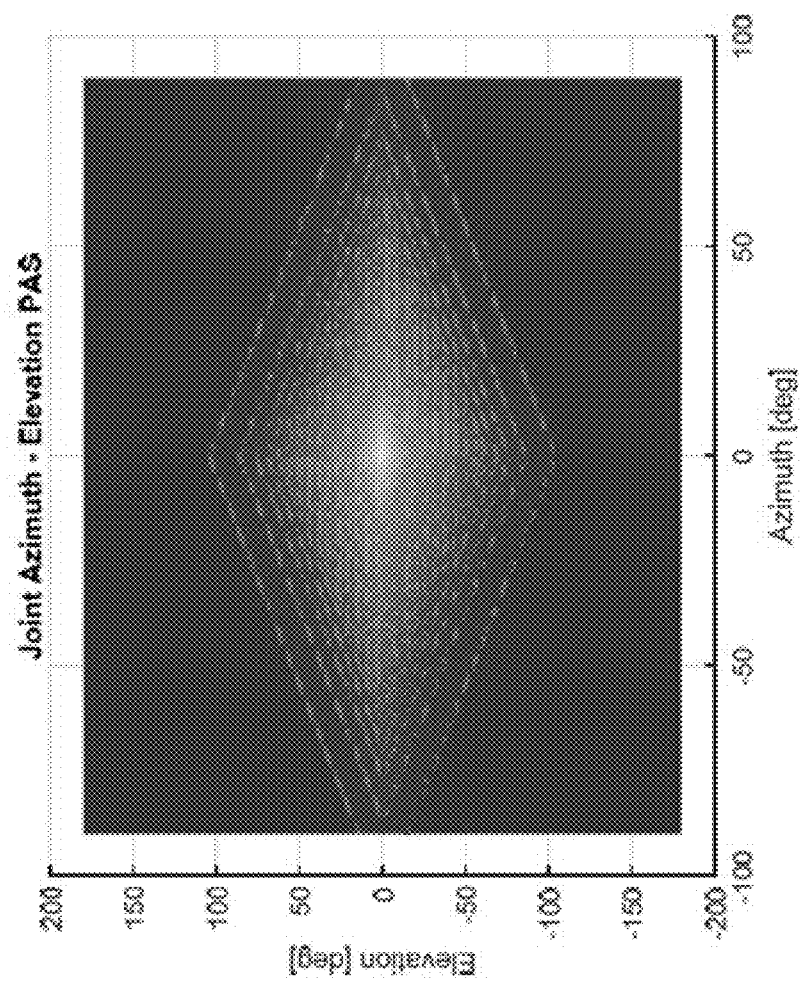
FIG. 11 illustrates a single cluster joint azimuth, elevation PAS, for the example case in which the marginal distribution is the multiplication of both azimuth and elevation.

FIG. 11 illustrates a single cluster joint azimuth, elevation PAS, for the example case in which the marginal distribution is the multiplication of both azimuth and elevation. In the following description, we assume that the cluster is modelled by dual Laplacian distribution and filtered by the gNb antenna. The same antenna locations apply, even if the antenna filtering is not done, but the power weights would be calculated differently.

If the 3D probe layout is highly truncated in elevation, the correlation becomes high. Even though correlation is not the KPI of FR2 NR device testing, it affects the MIMO throughput maximum performance. Thus, probe layout provides a means to have as good performance as possible. This is enabled only if the antenna separation is wide enough to have also low correlation values. Each cluster in spatial domain (AoA-ZoA) is listed in Table 11 next.

TABLE 11

Clusters In Spatial Domain

| Channel Model | Scaling | AoA | ZoA |
|---|---|---|---|
| CDL-A | UMi | −157.6340, −157.6340, −157.6340 | 88.9311, 88.9311, 88.9311 |
|  | InO | −157.4900, −157.4900, −157.4900 | 90.2073, 90.2073, 90.2073 |
| CDL-C | UMi | 164.1145, 164.1145, 129.1633, 164.1145, 129.1633, 129.1633, −152.8206 | 74.7544, 74.7544, 72.5229, 74.7544 , 72.5229, 72.5229, 71.1282 |
|  | InO | 164.4166, 164.4166, 164.4166 | 76.0412, 76.0412, 76.0412 |

CDL-A UMI, InO and CDL-C InO are single cluster models. Taking the maximum and minimum of the AoA and ZoA, the AoA spans over 78 degrees and ZoA over 19 degrees. If we filter out the duplicates of the angles, we get locations of the mean directions of the clusters. At the same time, we also convert negative angles to positive. Because the required minimum angular separation between antennas is 3.27 degrees to guarantee proper isolation, we can further reduce the cluster directions. If 3 degrees separation is assumed, the set of locations (rounded to full degrees) listed in Table 12 is obtained.

TABLE 12

Clusters after Duplicates Filtered, with 3 Degrees of Separation

| | |
|---|---|
| AoA | 202, 164, 129, 207 |
| ZoA | 90, 74, 71, 76 |

The co-ordinates listed in Table 12 form the 4 antennas around which the clusters are formed. Each cluster will have 4 surrounding antennas around the main direction to model spread (filtered by gNb antenna). That is, the arrangement is based on 4 probe locations, and each location has 5 probes to form one cluster at each location for a total of 20 probes. Switching may be used to activate a subset of the 20, so the best ones for a given channel model might be used at a given time. In order to avoid a situation in which the correlation is high everywhere and no MIMO performance is seen, it is recommended that the antennas are at least 20 degrees out of the main direction, so that the farthermost antennas are at least 10 degrees out of the maximum spread defined by the AoA-ZoA. This yields that span of 78 degrees will expand to 98 degrees in azimuth and 39 degrees in elevation. In another design we can distribute clusters across multiple probes, and it is not necessary to have multiple probes dedicated to emulating a single cluster at a defined location. The spreading of probe locations is usable to model spread of the cluster and select probes based on the channel model.

Radiator locations are defined by channel model such that PSP seen by DUT is maximized by moving the radiators and weighting the radiated power by equation (1). The optimization is constrained by practical limitations, such as cabling and minimum distance between probes, as well as ease of mechanical construction to limit the size of the anechoic chamber. This leads to the diamond shape construction, which was selected as baseline for 3GPP standardization. Spread of the signal is wider in azimuth domain than in elevation domain. If the signal is not filtered, 90% of the energy yields a very big installation. There are no clusters in the middle, with azimuth from −70 deg to 20 deg. Clusters are wrapped with 180 degree and −180 degrees. If zero azimuth is boresight, the signals enter from the back.

Particular Implementations

We describe various implementations of an anechoic test chamber, including six antenna probes; and at least five of the probes are aligned in the anechoic chamber such that the probes are aligned in azimuth along four columns separated from a center point by +/−5 degrees and +/−15 degrees; and the probes are further aligned in elevation along three rows at the center point and separated from the center point by +/−5 degrees. The alignments in azimuth and elevation are within 3 degrees measured spherically of the alignments stated.

In some disclosed implementations of the anechoic test chamber, the alignments in azimuth and elevation are within 2 degrees measured spherically of the alignments stated.

In other disclosed implementations of the anechoic test chamber, the alignments in azimuth and elevation are within 1 degree measured spherically of the alignments stated.

In many disclosed implementations of the anechoic test chamber, the probes are dual polarized test antennas.

In some disclosed implementations of the anechoic test chamber, the probes are antenna arrays configurable for phase difference beam forming. In some cases, the antenna arrays include at least 2×2 antenna elements. The antenna arrays can be planar arrays or linear arrays with four or more elements.

Some disclosed implementations of the anechoic test chamber include RF test sources operatively coupled to deliver RF signals to the probes. In some cases, the RF test sources deliver the RF signals at a frequency in a 5G FR2 frequency band. The RF test sources deliver the RF signals at a frequency in a range of 6.25 GHz and 10 GHz, and can deliver the RF signals at a frequency of 24.25 GHz to 71 GHz.

In some disclosed implementations of the anechoic test chamber, the alignments of five of the probes define a hexagon-like pattern that is wider than it is tall and has a missing vertex.

We also describe a method of using five to seven probes in an anechoic chamber for 5G Massive Multiple Input Multiple Output (MIMO) testing, including dividing the probes into probe groups corresponding to a plurality of channel models, such as CDL-A and CDL-C models. The disclosed method also includes determining fixed positions for the probes in the probe groups on a wall of the anechoic chamber, wherein the fixed positions accommodate applying the channel models during tests upon rotation in elevation and azimuth of a DUT in the anechoic chamber to orient the device and probes according to the channel model being applied. The channel models are applied using different rotations of the DUT, and weights for average power level applied to respective probes in the probe groups are separately determined for each of the channel models with respective DUT rotations.

Some implementations of the disclosed method further include adjusting a position of the DUT in the anechoic chamber relative to the probes according to the channel model being applied, wherein the channel models are applied using different positions of the DUT.

Many implementations of the disclosed method further include weighting the average power level on each probe to create the desired response for one of the channel models.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options.

This system implementation and other systems disclosed optionally include one or more of the following features. System can also include features described in connection with methods disclosed. In the interest of conciseness, alternative combinations of system features are not individually enumerated. Features applicable to systems, methods, and articles of manufacture are not repeated for each statutory class set of base features. The reader will understand how features identified in this section can readily be combined with base features in other statutory classes.

We claim as follows:

1. An anechoic test chamber, including:
   a subset of six selected antenna probes that are active from a full set of probes that are available in the anechoic test chamber; and at least five of the probes are positioned in the anechoic chamber such that
the probes are aligned in azimuth along four first lines separated from a center point by +/−5 degrees and +/−15 degrees; and
the probes are further aligned in elevation along three second lines perpendicular to the first lines at the center point and separated from the center point by +/−5 degrees; and
wherein the alignments in azimuth and elevation are within 3 degrees measured spherically of the alignments stated.

2. The anechoic test chamber of claim 1, wherein the alignments in azimuth and elevation are within 2 degrees measured spherically of the alignments stated.

3. The anechoic test chamber of claim 1, wherein the alignments in azimuth and elevation are within 1 degree measured spherically of the alignments stated.

4. The anechoic test chamber of claim 1, wherein the probes are dual polarized test antennas.

5. The anechoic test chamber of claim 1, wherein the probes are antenna arrays configurable for phase difference beam forming.

6. The anechoic test chamber of claim 5, wherein the antenna arrays include at least 2×2 antenna elements.

7. The anechoic test chamber of claim 1, further including RF test sources operatively coupled to deliver RF signals to the probes.

8. The anechoic test chamber of claim 7, wherein the RF test sources deliver the RF signals at a frequency in a 5G FR2 frequency band.

9. The anechoic test chamber of claim 8, wherein the RF test sources deliver the RF signals at a frequency in a range of 6.25 and 10.5 GHz.

10. The anechoic test chamber of claim 8, wherein the RF test sources deliver the RF signals at a frequency of 24.25 GHz to 71 GHz.

11. The anechoic test chamber of claim 1, wherein the alignments of five of the probes define a hexagon-like pattern that is wider than it is tall and has a missing vertex.

12. A method of testing a wireless device in an anechoic test chamber, including:
placing a wireless device under test (DUT) in an anechoic test chamber on a rotatable device holder;
exposing the DUT to signals from a subset of six active antenna probes that are selected from a full set of probes that are available in the anechoic test chamber; and
wherein at least five of the probes are positioned in the anechoic chamber such that
the probes are aligned in azimuth along four first lines separated from a center point by +/−5 degrees and +/−15 degrees; and
the probes are further aligned in elevation along three second lines perpendicular to the first lines at the center point and separated from the center point by +/−5 degrees; and
wherein the alignments in azimuth and elevation are within 3 degrees measured spherically of the alignments stated; and
conducting a test of the DUT using the signals.

13. The method of claim 12, wherein the alignments in azimuth and elevation are within 2 degrees measured spherically of the alignments stated.

14. The method of claim 12, wherein the alignments in azimuth and elevation are within 1 degree measured spherically of the alignments stated.

15. The method of claim 12, wherein the probes are dual polarized test antennas.

16. The method of claim 12, wherein the probes are antenna arrays configurable for phase difference beam forming.

* * * * *